(12) United States Patent
Pekarik et al.

(10) Patent No.: US 11,171,210 B2
(45) Date of Patent: Nov. 9, 2021

(54) DOUBLE MESA HETEROJUNCTION BIPOLAR TRANSISTOR

(71) Applicant: GLOBALFOUNDRIES U.S. INC., Grand Cayman (KY)

(72) Inventors: John J. Pekarik, Underhill, VT (US); Vibhor Jain, Williston, VT (US)

(73) Assignee: GLOBALPOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/804,435

(22) Filed: Feb. 28, 2020

(65) Prior Publication Data

US 2021/0111247 A1 Apr. 15, 2021

Related U.S. Application Data

(60) Provisional application No. 62/914,040, filed on Oct. 11, 2019.

(51) Int. Cl.
*H01L 29/10* (2006.01)
*H01L 29/66* (2006.01)
*H01L 29/08* (2006.01)
*H01L 29/737* (2006.01)

(52) U.S. Cl.
CPC ...... *H01L 29/1004* (2013.01); *H01L 29/0817* (2013.01); *H01L 29/66242* (2013.01); *H01L 29/7371* (2013.01)

(58) Field of Classification Search
CPC ............ H01L 29/1004; H01L 29/7371; H01L 29/0817; H01L 29/66242
See application file for complete search history.

(56) References Cited

U.S. PATENT DOCUMENTS

| | | | |
|---|---|---|---|
| 4,195,307 A | 3/1980 | Jambotkar | |
| 5,177,583 A | 1/1993 | Endo et al. | |
| 6,642,553 B1* | 11/2003 | Drews | H01L 29/66242 257/197 |
| 6,982,442 B2 | 1/2006 | Chan et al. | |
| 7,598,539 B2 | 10/2009 | Wilhelm | |
| 8,536,012 B2 | 9/2013 | Camillo-Castillo et al. | |
| 8,933,537 B2 | 1/2015 | Fox et al. | |
| 9,093,491 B2* | 7/2015 | Adkisson | H01L 29/1004 |
| 2014/0217551 A1* | 8/2014 | Dunn | G06F 30/30 257/565 |
| 2018/0040611 A1* | 2/2018 | Jain | H01L 21/8222 |

\* cited by examiner

*Primary Examiner* — Syed I Gheyas
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to a heterojunction bipolar transistor and methods of manufacture. The structure includes: a sub-collector region; a collector region above the sub-collector region; an intrinsic base region composed of intrinsic base material located above the collector region; an emitter located above and separated from the intrinsic base material; and a raised extrinsic base having a stepped configuration and separated from and self-aligned to the emitter.

17 Claims, 7 Drawing Sheets

DOUBLE MESA HETEROJUNCTION BIPOLAR TRANSISTOR

FIELD OF THE INVENTION

The present disclosure relates to semiconductor structures and, more particularly, to a heterojunction bipolar transistor and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications and require low collector-base capacitance (Ccb), low base resistance (Rb), high cut-off frequencies (fT/f MAX) and high breakdown voltage (BVceo).

In high performance Si/SiGe HBT technologies, the emitter is almost universally formed inside of a hole etched into the extrinsic base layer. This results in complicated integration schemes for self-aligned emitter-base junction due to lack of an etch-stop layer for the extrinsic base etch during emitter formation. An emitter-before-extrinsic base integration architecture can resolve some of these issues but results in a non-self-aligned emitter base junction. Self-aligned schemes with emitter first face many challenges including, e.g.: lack of an end-point signal for the emitter etch due to the sparse and varying emitter pattern; difficult process schemes to form spacers, which separate the emitter and the base; and an uneven top surface on which to form a contact to the emitter. Also, some integration schemes can result in high Ccb (parasitic capacitance) and high Rb, which is a concern in bipolar technologies as it limits device scaling for improved fT/f MAX.

SUMMARY

In an aspect of the disclosure, a structure comprises: a sub-collector region; a collector region above the sub-collector region; an intrinsic base region composed of intrinsic base material located above the collector region; an emitter located above and separated from the intrinsic base material; and a raised extrinsic base having a stepped configuration and separated from and self-aligned to the emitter.

In an aspect of the disclosure, a structure comprises: a sub-collector region; a collector region above the sub-collector region; an intrinsic base above the collector region; an emitter vertically separated from the intrinsic base by an epitaxial film; an extrinsic base self-aligned to the emitter and separated from the emitter by the epitaxial film; and an extrinsic base formed directly on the intrinsic base and on part of the epitaxial film, the extrinsic base having a stepped portion.

In an aspect of the disclosure, a method comprises: forming a collector region and a base region by epitaxy processes; depositing a dielectric layer on top of the base region; opening a window in the dielectric layer; growing semiconductor material in the window by selective epitaxy to an approximate thickness of the dielectric layer; forming a semiconductor emitter film on the semiconductor material; patterning the semiconductor emitter film, stopping on the dielectric layer; forming a spacer around the emitter; patterning and etching the base region; and forming contacts to the emitter, the base region and the collector region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
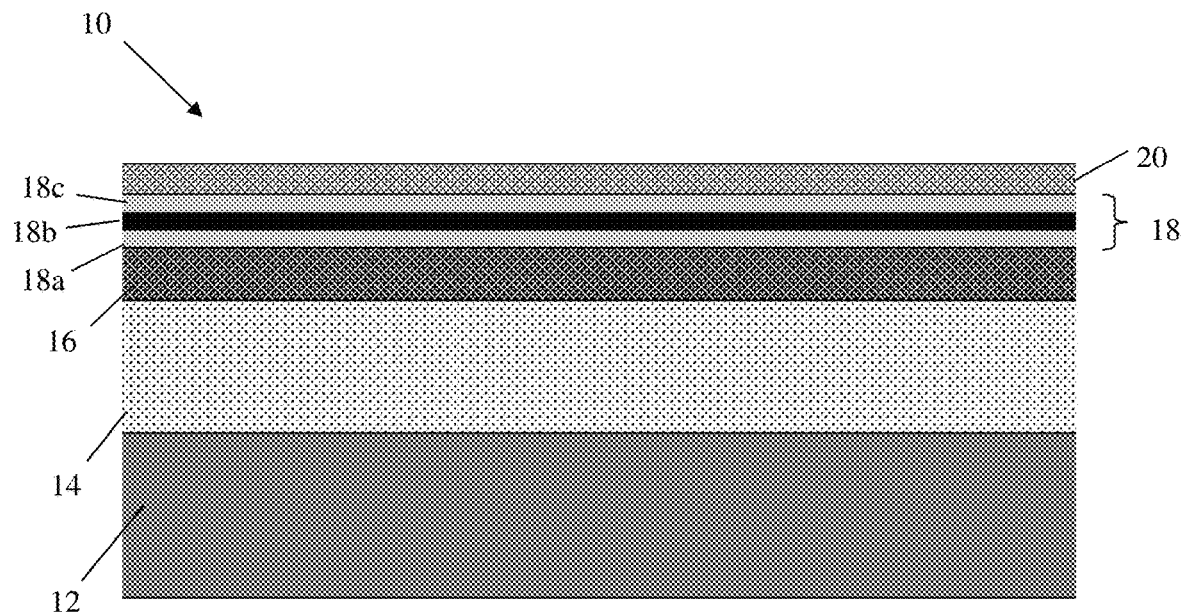
FIG. 1 shows a substrate with a collector material and base material, amongst other features, and respective fabrication processes in accordance with aspects of the present disclosure.

The present disclosure relates to semiconductor structures and, more particularly, to a heterojunction bipolar transistor and methods of manufacture. More specifically, the heterojunction bipolar transistor includes a self-aligned double-mesa emitter with a staggered or stepped, single crystal extrinsic base formed on epitaxial semiconductor material, e.g., silicon. Advantageously, the heterojunction bipolar transistor provides low Rb (higher f MAX) due to improved connection between the extrinsic base and the intrinsic base, with improved control of emitter diffusion for lower Cbe (higher fT at low bias at less power for the same circuit performance). For example, the self-aligned extrinsic base junction results in ~20-30% higher f MAX compared to conventional processing schemes, while also providing cost savings due to the need for less processing steps.

In more specific embodiments, the heterojunction bipolar transistor is a self-aligned SiGe heterojunction bipolar transistor where, for example: (i) the intrinsic base and the emitter are vertically separated by an epitaxial film; (ii) a raised single crystal extrinsic base is self-aligned to the emitter and is separated from the emitter by the same epitaxial film; (iii) the extrinsic base is formed directly on the intrinsic base and on part of the epitaxial film; and (iv) the extrinsic base is staggered/stepped adjacent to the emitter. Accordingly, the heterojunction bipolar transistor includes an extrinsic base grown over the intrinsic base and also connected to the intrinsic device through the epitaxial layer, adjacent to the extrinsic base. In addition, the emitter can have a planar top surface.

Moreover, in embodiments, the emitter is formed as a mesa, with the etch process (which forms the mesa) ending on an etch stop material, e.g., oxidation layer, that provides an endpoint signal. This process provides a simpler process than existing self-aligned process schemes. To this end and by way of an example, the method for forming the bipolar transistor comprises: forming the collector and base material by epitaxy and/or ion implantation processes; depositing a dielectric layer (e.g. silicon dioxide) on top of the base region and opening a window in the dielectric layer (e.g., insulator material) to grow semiconductor material in the window by selective epitaxy to the approximate thickness of the dielectric layer; depositing or growing, by non-selective epitaxy, a doped semiconductor emitter layer; patterning and etching the emitter, stopping the etch on the dielectric layer; forming a dielectric spacer around the emitter and patterning and etching the base region; and forming contacts to the emitter, base and collector. In embodiments, the base contact layer can be grown or deposited on top of the base.

The heterojunction bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the heterojunction bipolar transistor of the present disclosure have been adopted from integrated circuit (IC) technology. For example, the structures are built on wafers and are realized in films of material patterned by photolithographic processes on the top of a wafer. In particular, the fabrication of the heterojunction bipolar transistor uses three basic building blocks: (i) deposition of thin films of material on a substrate, (ii) applying a patterned mask on top of the films by photolithographic imaging, and (iii) etching the films selectively to the mask.

FIG. 1 shows a substrate with a collector material and base material, amongst other features, and respective fabrication processes in accordance with aspects of the present disclosure. More specifically, the structure 10 of FIG. 1 includes a lightly doped p-type substrate 12 composed of semiconductor material and, preferably, bulk Si material. In any of the embodiments, the substrate 12 may be composed of any suitable material including, but not limited to, Si (e.g., single crystalline Si), SiGe, SiGeC, SiC, GaAs, InAs, InP, and other III/V or II/VI compound semiconductors.

In further embodiments, the substrate 12 may be silicon on insulator technology (SOI) which includes an insulator layer on top of the semiconductor layer and another semiconductor layer (e.g., single crystalline Si), on top of the insulator layer. The insulator is formed by any suitable process such as separation by implantation of oxygen (SIMOX), oxidation, deposition, and/or other suitable process. The other semiconductor layer on top of the insulator layer can be fabricated using wafer bonding, and/or other suitable methods.

Still referring to FIG. 1, a sub-collector region 14 is formed within or on the substrate 12. The sub-collector region 14 can be a highly doped n-type region, i.e., phosphorus or arsenic, formed by ion implantation processes or other known diffusion processes such that no further explanation is required herein. In embodiments, sub-collector region 14 can be formed from a heavily doped epitaxy layer of material grown on the substrate 12.

A collector material 16 is provided on the sub-collector region 14. The collector material 16 can be a doped n-type material, formed using an eptiaxial growth process with in-situ dopant process similar to that of the sub-collector region 14. Also, in embodiments, the collector material 16 can be any semiconductor material, e.g., Si material, and preferably is a single crystalline Si material; although other semiconductor materials are contemplated herein. Doping and thickness of the collector layer 16 can be tuned for desired device performance.

FIG. 1 further shows a base region (e.g., instrinsic base region) 18 formed on the collector materuial 16. In embodiments, the base region 18 is an intrinsic base region composed of epitaxial materials 18a, 18b, 18c. For example, the base region 18 can be composed of undoped semiconductor material 18a, 18c, e.g., Si, with a SiGe material 18b sandwiched between the semicondcutor materials 18a, 18c. In embodiments, the semiconductor material 18a, 18c can also be n-type doped materials or p-typed doped materials. In further embodiments, the dopant concentration is preferably less than 1e17. On the other hand, the SiGe material 18b is preferably a p-doped epitaxially grown material, where the dopant can be, e.g., boron and can contain carbon. In embodiments, the carbon can be used to reduce dopant diffusion. As with the material 18b, the materials 18a, 18c can also be single crystalline semiconductor material formed by conventional epitaxial growth processes with in-situ doping (or ion implantation processes).

FIG. 1 further shows an insulator material 20, e.g., oxide, blanket deposited on the semicoductor material 18c. By way of example, the insulator material 20 can be a dielectric material such as an oxide layer deposited by a blanket deposition method such as a chemical vapor deposition (CVD) process. The insulator material 20 can undergo a rapid thermal oxidation process as is known in the art such that no further explanation is required for a complete understanding of the present disclosure.

Figure 2:
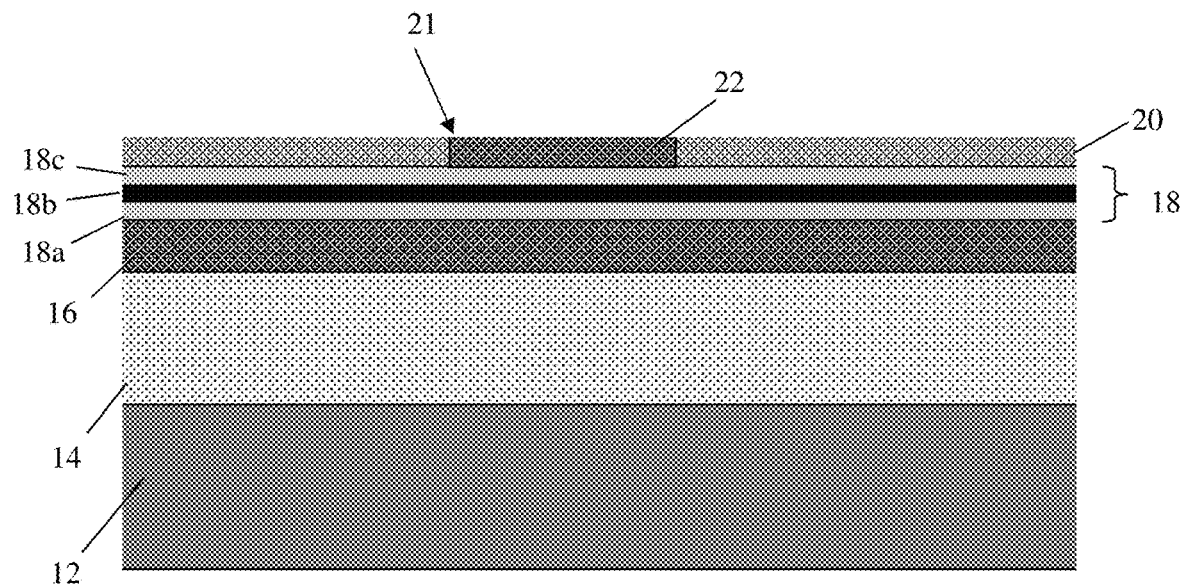
FIG. 2 shows an epitaxial grown material within an opening and directly on the base material, amongst other features, and respective fabrication processes in accordance with aspects of the present disclosure.

FIG. 2 shows an epitaxial grown material within an opening or window of the insulator material, amongst other features. More specifically, in FIG. 2, an opening (e.g., window) 21 is formed within the insulator material 20, exposing the underlying material 18c of the base region 18. In embodiments, the opening 21 can be formed by conventional lithography and etching methods known to those of skill in the art. For example, a resist formed over the insulator material 20 is exposed to energy (light) to form a pattern (opening). An etching process with a selective chemistry, e.g., reactive ion etching (RIE), will be used to form the opening 21 in the insulator material 20 through the openings of the resist. It should be understood that the litho-defined opening 21 is not a critical dimension or overlay.

Following the resist removal by a conventional oxygen ashing process or other known stripants, a semiconductor material 22 is epitaxially grown within the opening 21 on the material 18c. In embodiments, the semiconductor material 22 can be selectively grown in the opening 21, which will separate the emitter from the underlying base region 18. The semiconductor material 22 can be an N– doped or undoped layer of epitaxially grown Si material; although other materials are also contemplated herein. In further exemplary embodiments, the semiconductor material 22 can have a doping gradient from N− to N+. The thickness of the semiconductor material 22 can be adjusted based on extrinsic base junction requirements and doping in the film itself, as examples.

Figure 3:
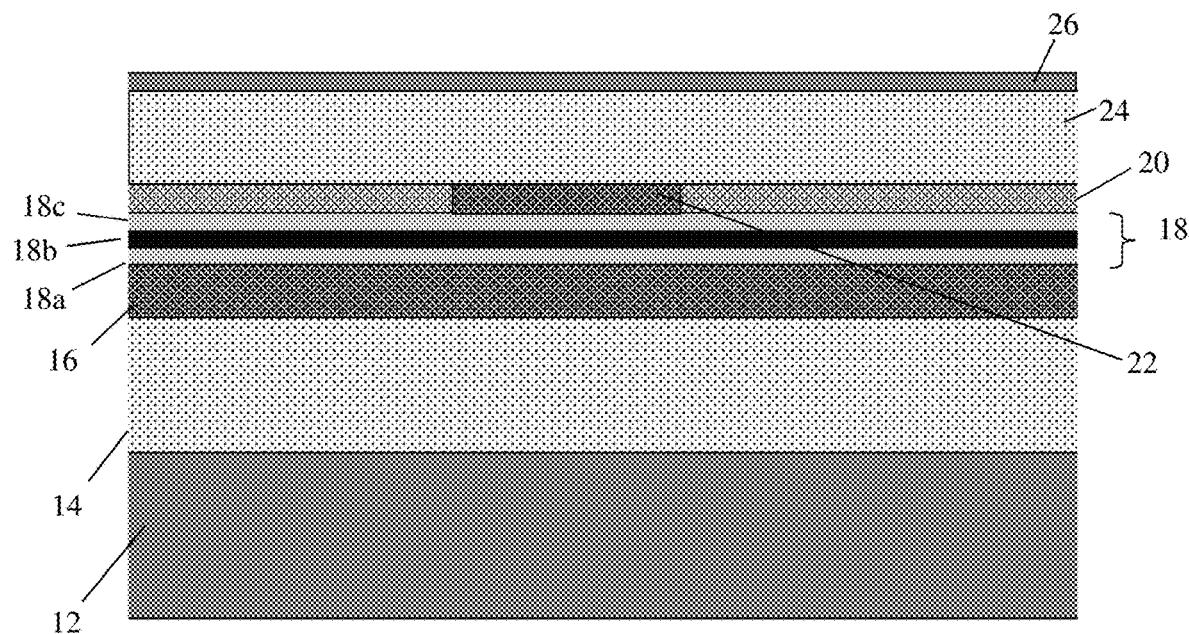
FIG. 3 shows an emitter film deposited on the epitaxial material, amongst other features, and respective fabrication processes in accordance with aspects of the present disclosure.

In FIG. 3, an emitter film 24 is deposited directly on the epitaxially grown semiconductor material 22 and insulator material 20. In embodiments, the emitter film 24 can be a doped semiconductor material, e.g., N+ doped Si material. The emitter film 24 can be deposited by any conventional deposition method including, e.g., CVD, or grown by non-selective epitaxy processes. In embodiments, the emitter film 24 has a planar top surface. A capping material 26 is optionally deposited on the emitter film 24. The capping material 26 is preferably a nitride hard mask, as one example.

Figure 4A:
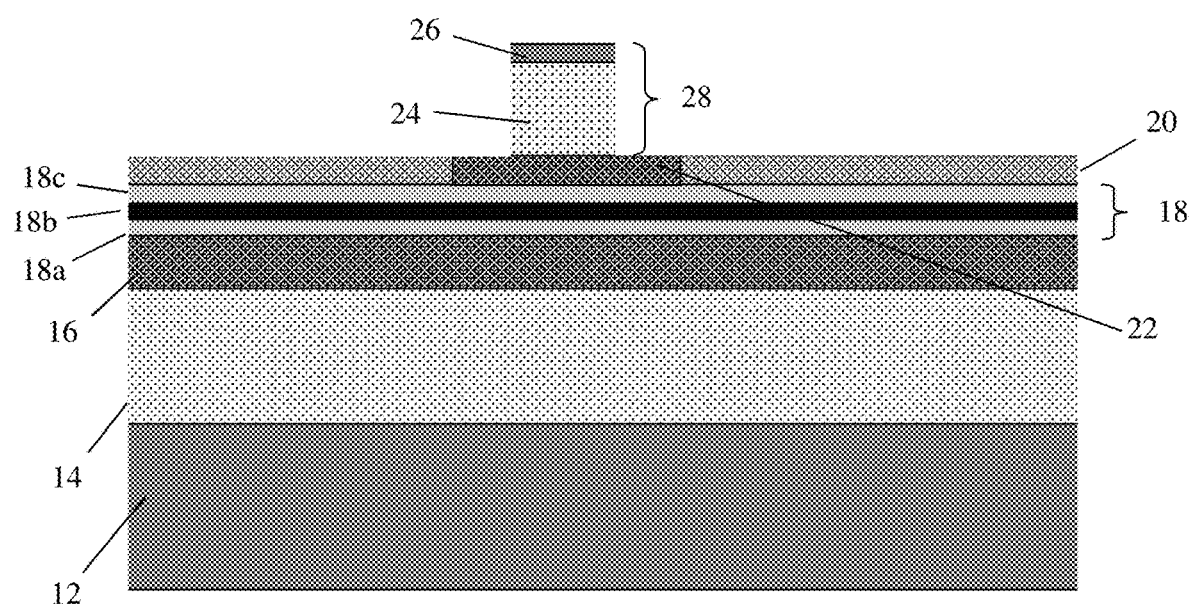
FIGS. 4A and 4B show an emitter formed as a mesa, amongst other features, and respective fabrication processes in accordance with aspects of the present disclosure.
Figure 4B:
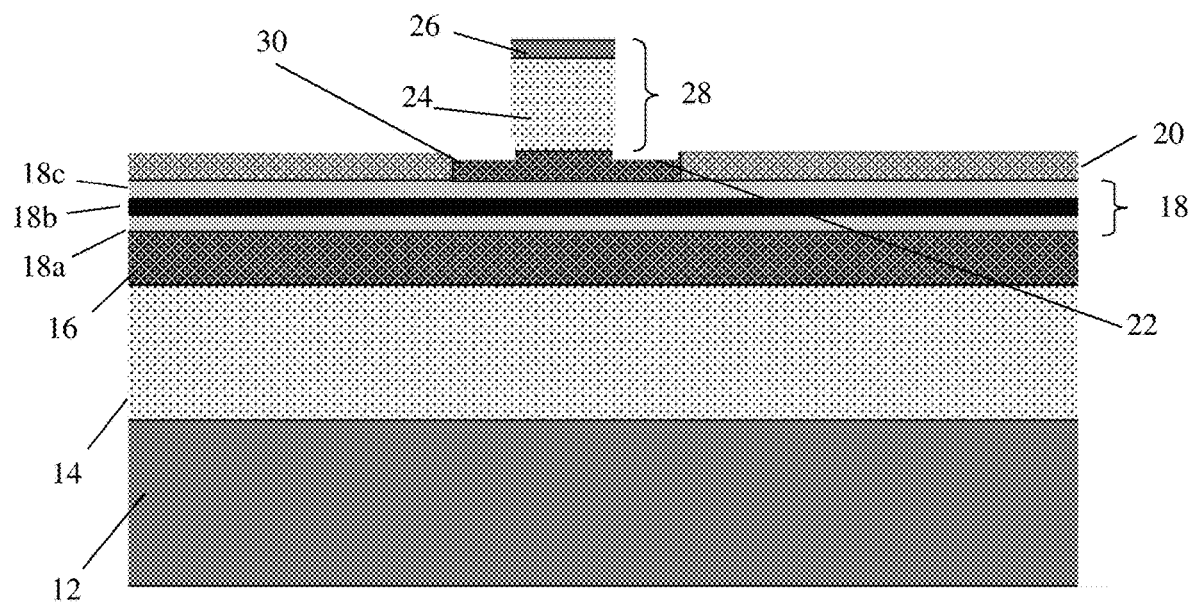

FIGS. 4A and 4B show an emitter 28 formed as a mesa, amongst other features, and respective fabrication processes. More specifically, in FIGS. 4A and 4B, the emitter 28 is formed by an emitter etching process, which forms a mesa structure. In both FIGS. 4A and 4B, the intrinsic base 18 and the emitter 28 will remain vertically separated by the epitaxial material 22 within the opening 21.

In FIG. 4A, for example, the emitter film 24 and capping material 26 will undergo an etching process, stopping at the defined end point of the insulator material 20. In FIG. 4B, a slight over-etch of the semiconductor material 22 is provided to assure the insulator material 20 is clear of semiconductor material. As should be understood by those of skill in the art, the insulator material 20 (e.g., oxidation layer) will provide an endpoint signal indicating that the etch process should stop. This process provides a simpler process than existing self-aligned schemes. In either of these schemes, the width of the emitter 28 is less than the width of the semiconductor material 22 (i.e., epitaxial film) such that the emitter etch has the semiconductor material 22 (i.e., epitaxial film) exposed on either side.

Figure 5:
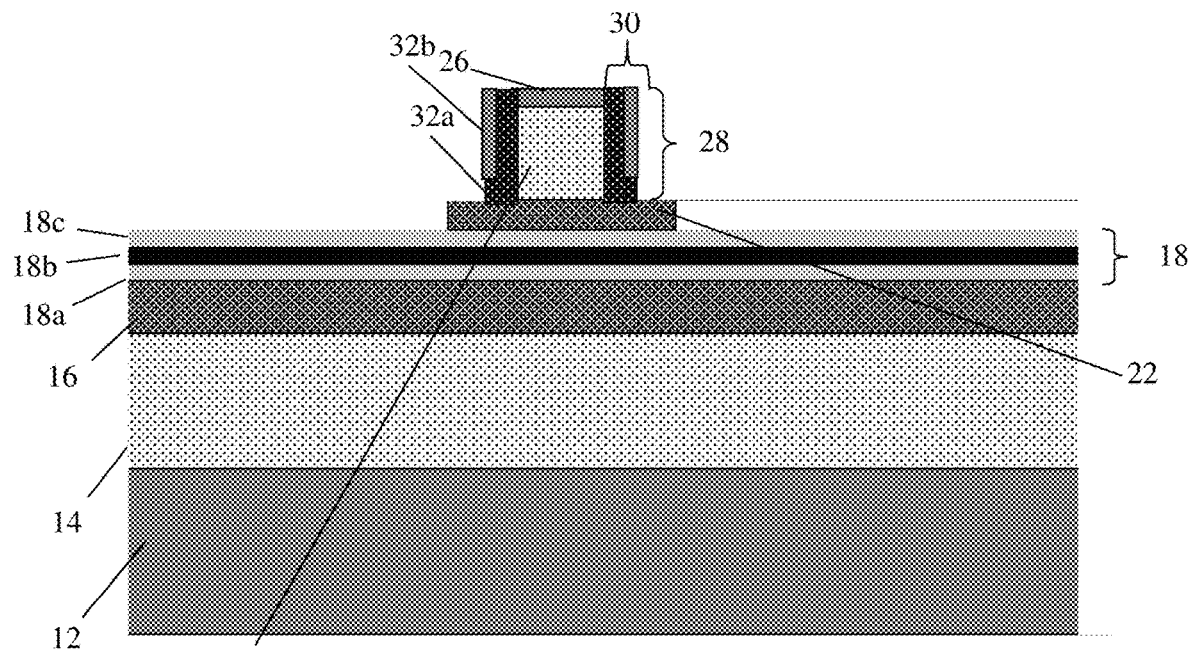
FIG. 5 shows sidewalls on the emitter, amongst other features, and respective fabrication processes in accordance with aspects of the present disclosure.

In FIG. 5, sidewalls 30 are formed on (e.g., around) vertical sides of the emitter 28. In this process, an oxide material 32a is blanket deposited on the emitter 28 and directly over the insulator material 20. A nitride material 32b is then blanket deposited on the oxide material 32a. An anisotropic etching process is used to remove the nitride material 32b on the horizontal surfaces of the structure, followed by an anisotropic etching process to remove the oxide material 32 and insulator material 20 on the horizontal surfaces of the structure. In this way, the oxide material 32a and the nitride material 32b, which form the sidewalls 30, will remain on the vertical surfaces (e.g., sidewalls) of the emitter 28, with the semiconductor material 18c of the instrinsic base region 18 and portions of the semiconductor material 22 being exposed. As shown, after sidewall formation, the width of the emitter 28 will still be less than the width of the semiconductor material 22 (i.e., epitaxial film) such that the semiconductor material 22 (i.e., epitaxial film) will remain exposed on either side.

Figure 6:
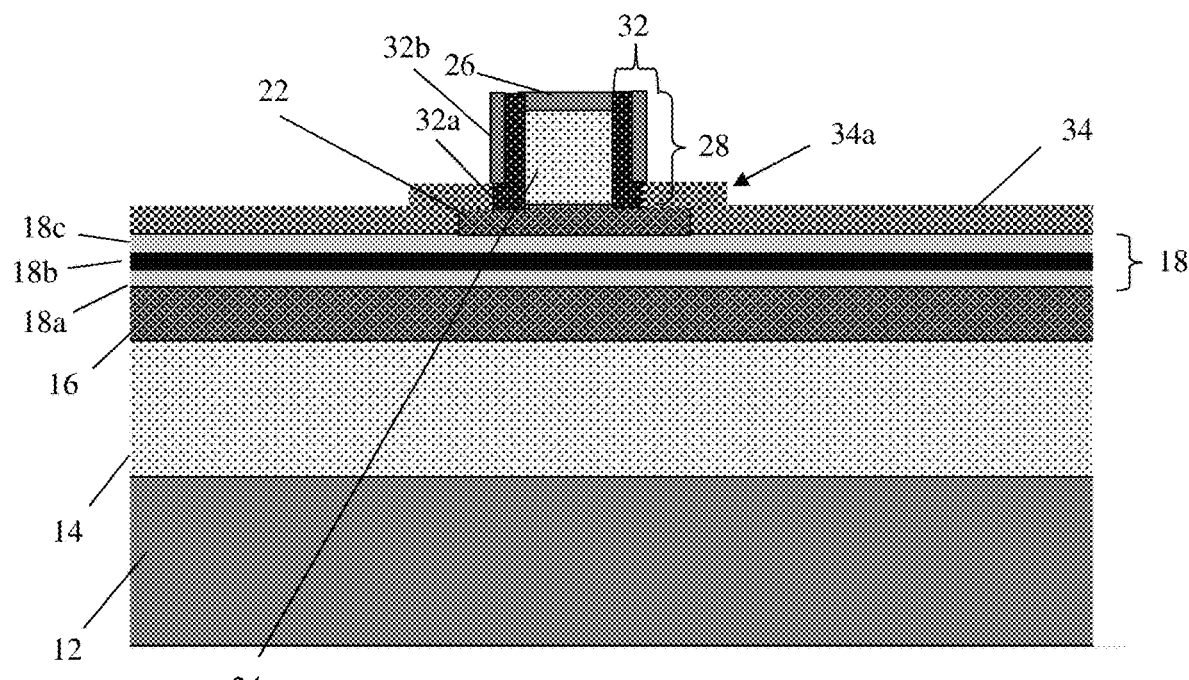
FIG. 6 shows an extrinsic base material with a stepped or staggered portion adjacent to the emitter, amongst other features, and respective fabrication processes in accordance with aspects of the present disclosure.

As further shown in FIG. 6, a semiconductor material 34 is selectively grown on the semiconductor material 18c of the instrinsic base region 18 and the semiconductor material 22. In embodiments, the semiconductor material 34 is a single crystalline material, e.g., Si or SiGe, which will be used to form a raised extrinsic base (as shown generally at reference numeral 35 in FIGS. 7A and 7B) or as a contact region, particularly in the case of thin base layers.

Also, as shown in FIG. 6, the semiconductor material 34 (which forms the extrinsic base) will have a discernible stepped or staggered portion 34a due to the presence of the epitaxial film, e.g., semiconductor material 22, below the emitter 28. Moreover, the extrinsic base (e.g., raised, single crystal structure) is self-aligned to the emitter 28 and is separated from the emitter 28 by the epitaxial film, e.g., semiconductor material 22, and the sidewalls 32.

Figure 7A:
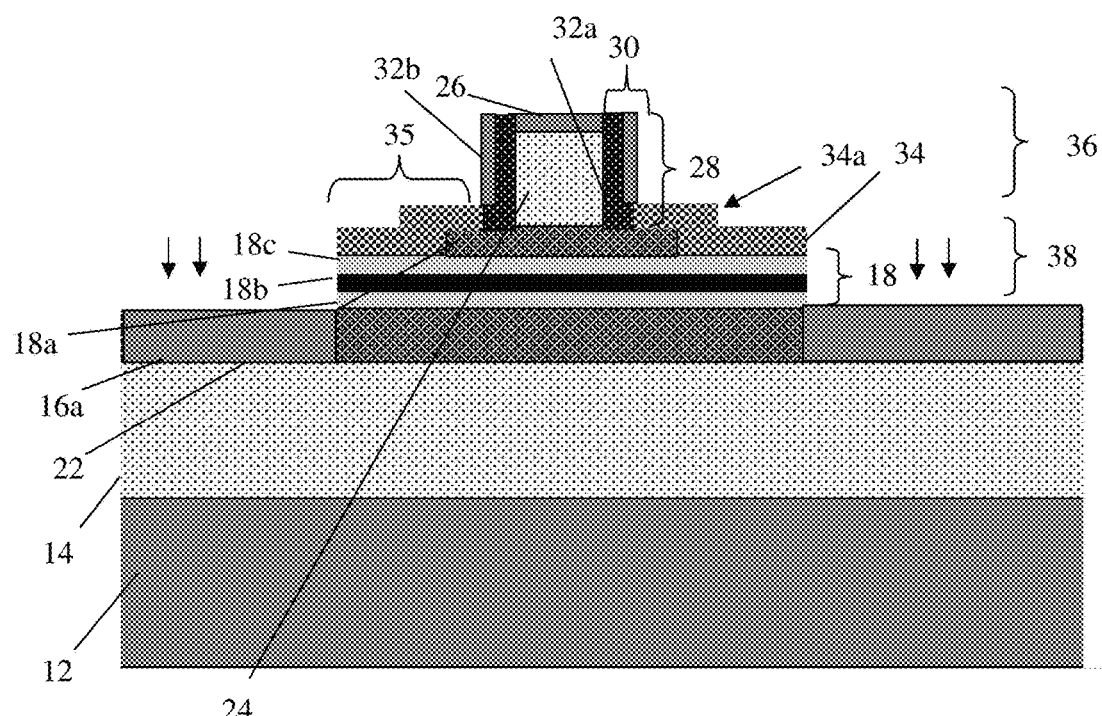
FIG. 7A shows an extrinsic base and a low resistance path to the sub-collector region, amongst other features, and respective fabrication processes in accordance with aspects of the present disclosure.
Figure 7B:
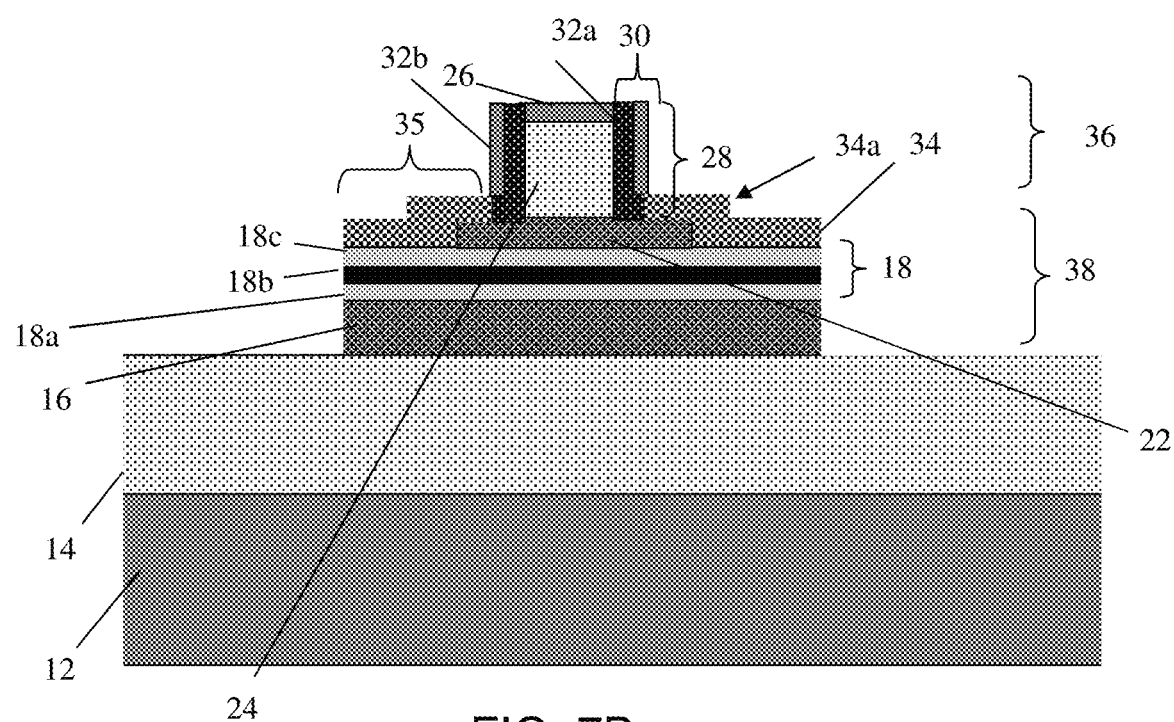
FIG. 7B shows an extrinsic base and an exposed sub-collector region, amongst other features, and respective fabrication processes in accordance with aspects of the present disclosure.

FIG. 7A shows the extrinsic base 35 and a low resistance path 16a to the sub-collector region 14, amongst other features. More specifically, in FIG. 7A, conventional lithography and etching processes are used to pattern the semiconductor material 34 to define the extrinsic base 35 and to expose the underlying collector material 16. The patterned extrinsic base 35 will continue to have a discernible stepped or staggered portion 34a over the epitaxial material 22. The exposed collector material 16 is then subjected to a doping process, e.g., an ion implantation process, to form a low-resistance path 16a to the sub-collector region 14. In embodiments, the low-resistance path 16a can be obtained by an implant n-type doping process. Alternatively, FIG. 7B shows the extrinsic base 35 and an etching process to expose the heavily doped sub-collector region 14. In this process, the etching process of FIG. 7A will remove the collector material 16 to expose the heavily doped sub-collector region 14.

In either scenario of FIG. 7A or 7B, the etching process will form a double mesa structure 36, 38. Specifically, the double mesa structure includes a mesa 36 comprising the emitter 28 and a mesa 38 comprising the extrinsic base 35 with the discernible stepped or staggered portion 34a. Accordingly, both FIGS. 7A and 7B show a self-aligned double-mesa emitter with a staggered or stepped, single crystal extrinsic base formed on epitaxial semiconductor material.

Figure 8A:
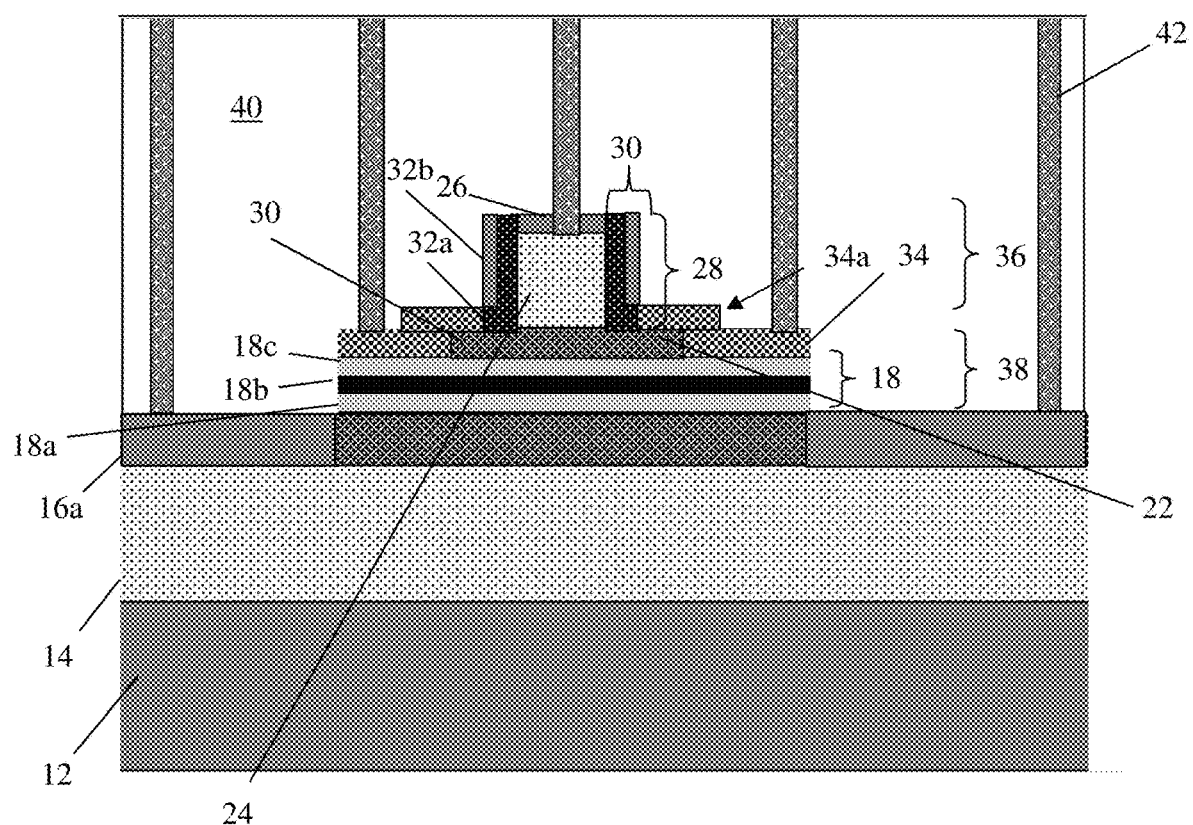
FIG. 8A shows contacts formed to the emitter, extrinsic base and a low resistance path to the sub-collector of FIG. 7A, and respective fabrication processes in accordance with aspects of the present disclosure.
Figure 8B:
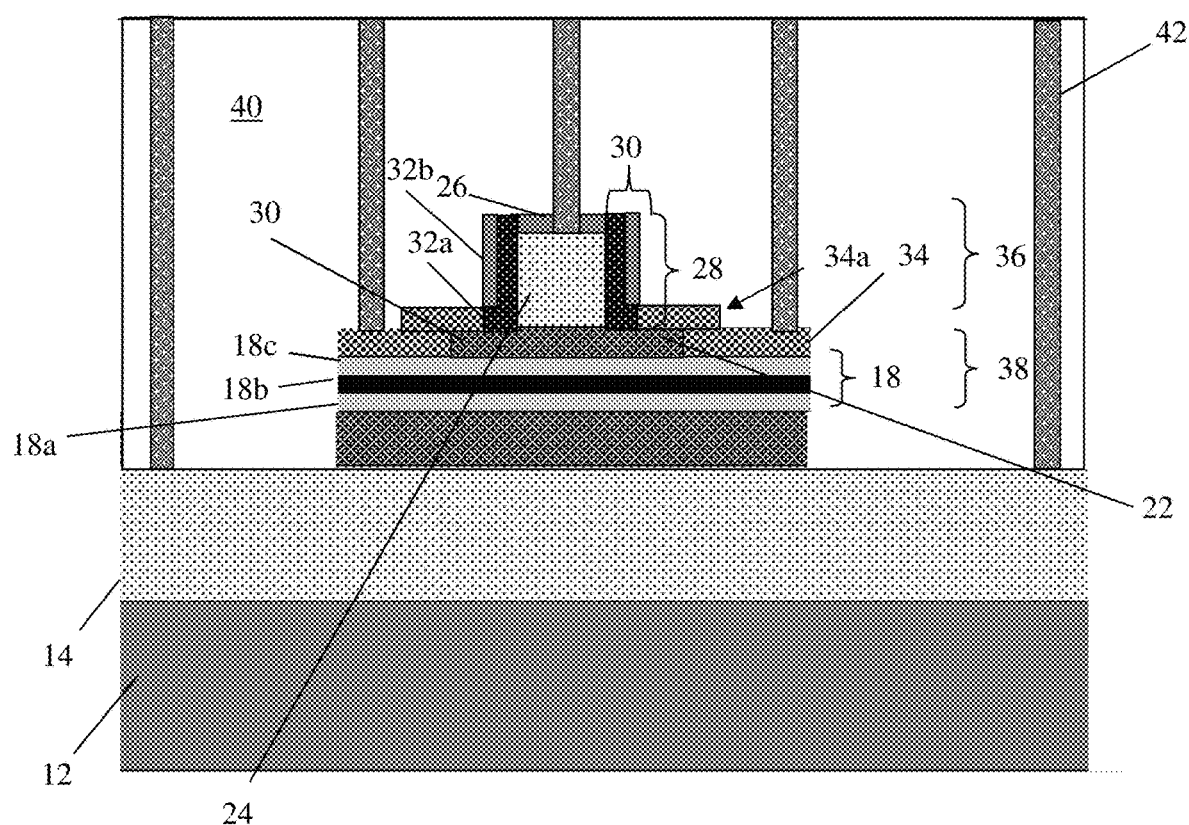
FIG. 8B shows contacts formed to the emitter, extrinsic base and sub-collector of FIG. 7B, and respective fabrication processes in accordance with aspects of the present disclosure.

FIG. 8A shows contacts 42 formed to the emitter 28, extrinsic base 35 and a low resistance path 16a to the collector region 16 of FIG. 7A. FIG. 8B shows contacts 42 formed to the emitter 28, extrinsic base 35 and sub-collector region 14 of FIG. 7B. In both FIGS. 7A and 7B, prior to contact formation, silicide contacts are formed in contact with the emitter 28, extrinsic base 35 and a low resistance path 16a or sub-collector region 14. As should be understood by those of skill in the art, the silicide process begins with deposition of a thin transition metal layer, e.g., nickel, cobalt or titanium, over fully formed and patterned semiconductor materials. After deposition of the material, the structure is heated allowing the transition metal to react with exposed silicon (or other semiconductor material as described herein) forming a low-resistance transition metal silicide contacts. Following the reaction, any remaining transition metal is removed by chemical etching, leaving silicide contacts.

A dielectric material 40 is deposited over the structure, followed by a lithography, etching and deposition processes (e.g., metallization process). For example, the dielectric material 40 is deposited by a CVD process, followed by the lithography and etching (e.g., RIE) processes to form trenches within the dielectric material 40. A metal material, e.g., aluminum or tungsten, is deposited within the trenches to form the contacts 42, e.g., collector contact, emitter region contact and extrinsic base contact. Any residual metal material can be removed from the surface of the dielectric material 40 by a conventional chemical mechanical planarization process.

The heterojunction bipolar transistor can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a sub-collector region;
   a collector region above the sub-collector region;
   an intrinsic base region composed of intrinsic base material located above the collector region;
   an emitter located above and separated from the intrinsic base material;
   a raised extrinsic base having a stepped configuration and separated from and self-aligned to the emitter; and
   an epitaxial film directly under the emitter,
   wherein the raised extrinsic base is composed of semiconductor material and part of the raised extrinsic base is on a same level as the epitaxial film.

2. The structure of claim 1, wherein the emitter is separated from the intrinsic base material by an epitaxial film that has a width larger than the emitter.

3. The structure of claim 1, wherein the intrinsic base material is vertically separated from the emitter by an epitaxial film.

4. The structure of claim 1, wherein the stepped configuration of the raised extrinsic base is adjacent to the emitter.

5. The structure of claim 4, wherein the stepped configuration of the raised extrinsic base is directly covering the epitaxial film.

6. The structure of claim 3, wherein the epitaxial film and the raised extrinsic base are directly contacting semiconductor material of the intrinsic base region.

7. The structure of claim 2, wherein doped material extending from the collector region above the sub-collector region and beyond edges of the epitaxial film form a low resistance path to the sub-collector region, and contacts connect directly to the low resistance path.

8. The structure of claim 1, wherein the emitter and the extrinsic base are provided in a double mesa structure.

9. A structure comprising:
   a sub-collector region;
   a collector region above the sub-collector region;
   an intrinsic base region composed of intrinsic base material located above the collector region;
   an emitter located above and separated from the intrinsic base material; and
   a raised extrinsic base having a stepped configuration and separated from and aligned to the emitter, wherein
   the intrinsic base material is vertically separated from the emitter by an epitaxial film,
   the raised extrinsic base is separated from the emitter by the epitaxial film which is directly under the emitter, and
   the raised extrinsic base is composed of semiconductor material directly contacting the intrinsic base material and part of the epitaxial film.

10. The structure of claim 9, wherein the semiconductor material is single crystalline material.

11. A structure comprising:
    a sub-collector region;
    a collector region above the sub-collector region;
    an intrinsic base above the collector region;
    an emitter vertically separated from the intrinsic base by an epitaxial film;
    an extrinsic base self-aligned to the emitter and separated from the emitter by the epitaxial film; and
    an extrinsic base formed directly on the intrinsic base and on part of the epitaxial film, the extrinsic base having a stepped portion.

12. The structure of claim 11, wherein the extrinsic base is a raised extrinsic base comprising a single crystal semiconductor material and the stepped portion is adjacent to the emitter and directly covering the epitaxial film.

13. The structure of claim 12, wherein the extrinsic base is separated from the emitter by the epitaxial film and sidewalls of the emitter.

14. The structure of claim 13, wherein collector material of the collector region is doped to form a low resistance path to the sub-collector region and a contact connects directly to the low resistance path.

15. The structure of claim 11, further comprising contacts connecting directly to the sub-collector region.

16. The structure of claim 11, wherein the epitaxial film that has a width larger than the emitter such that a surface of the epitaxial film remains exposed.

17. The structure of claim 11, wherein the emitter and the extrinsic base form a double mesa structure.

* * * * *